United States Patent [19]

Pyle

[11] Patent Number: 5,075,174
[45] Date of Patent: Dec. 24, 1991

[54] PARYLENE COATED ELASTOMERS

[75] Inventor: Jeffrey Pyle, Roanoke, Va.

[73] Assignee: Acadia Polymers, Inc., Roanoke, Va.

[21] Appl. No.: 560,520

[22] Filed: Jul. 31, 1990

[51] Int. Cl.$^5$ ............................................. B32B 9/04
[52] U.S. Cl. ................................... 428/447; 277/227;
277/228; 428/492; 428/523
[58] Field of Search .................... 428/492, 523, 447;
277/227, 228

[56] References Cited

U.S. PATENT DOCUMENTS

| | | | |
|---|---|---|---|
| 4,214,119 | 7/1980 | Keen, Jr. | 174/31 |
| 4,375,290 | 3/1983 | Zucchi et al. | 277/12 |
| 4,500,562 | 2/1985 | John et al. | 427/27 |
| 4,518,623 | 5/1985 | Riley | 427/8 |
| 4,580,794 | 4/1986 | Gibbons | 277/228 |
| 4,862,967 | 9/1989 | Harris | 166/387 |

OTHER PUBLICATIONS

Microcontamination, Jan. 1985, "Very Thin Coating for Contamination Control" by Roger Olson and Richard Veague.
Novatran Custom Coating Services—"Parylene Conformal Coating".
Novatran Corporation—"Parylene Conformal Coating Systems". Novatran Corporation—"Solvent Resistance of the Parylenes".
Novatran Corporation—"Parylene for Electronics".

*Primary Examiner*—Merrell C. Cashion, Jr.
*Assistant Examiner*—D. S. Nakarani
*Attorney, Agent, or Firm*—Burns, Doane, Swecker & Mathis

[57] ABSTRACT

An improved elastomeric gasket comprising a silicone elastomer coated with a parylene layer is disclosed. The parylene is selected from one of the parylene C, parylene N, parylene D, and mixtures thereof and applied to reduce the surface energy of the elastomeric material.

1 Claim, 1 Drawing Sheet

PARYLENE COATED ELASTOMERS

BACKGROUND OF THE INVENTION

The present invention relates to an improved elastomeric gasket which can be effectively employed in a variety of environments, particularly those environments, e.g., in computer and electronic equipment, in which traditional gaskets encounter a number of problems.

Seals or gaskets having a variety of shapes and sizes are employed throughout the computer and electronic industry. Because of the extreme sensitivity to contamination by particles having even minute proportions, these seals and gaskets must undergo an elaborate cleaning process in order to remove these particles. However, many of the elastomers employed have a high surface energy which serves to attract air borne particles and fibers. For this reason, it is very difficult and extremely expensive to provide adequate cleaning.

Moreover, when these gaskets are employed in a metal environment, e.g., in combination with a metal retainer for a contained volume, they are often subjected to surface bonding between the gaskets and the metal. This causes undesirable damage to the gaskets particularly in environments where the contained volume requires repeated openings.

Parylene has been employed in a variety of environments, e.g., in the computer and electronic industry as a coating for circuit boards, transducers, sensors, and microelectronic applications. See, for example, the discussion in NOVATRAN Custom Coating Services document entitled "Parylene Conformal Coating" which is incorporated herein by reference.

However, the need still exists for a gasket which can effectively overcome the problems described above.

SUMMARY OF THE INVENTION

In accordance with the foregoing objectives, the present invention relates to an improved seal or gasket. In particular, the seal or gasket consists of an elastomeric material having a desired shape which has a layer of parylene coated on the outer surface thereof wherein the parylene is selected from the group consisting of parylene-C, parylene-N, parylene-D or mixtures thereof and further wherein the layer has a thickness which is effective to reduce the surface energy of the elastomeric material.

DETAILED DESCRIPTION OF THE PREFERRED EMBODIMENT

The present invention relates to a seal or gasket which can be employed in a variety of environments, preferably in the electronics and computer industry. In particular, the gasket or seal of the present invention consists of an elastomeric material having a desired shape and which has a layer of parylene coated on the outer surface thereof.

The elastomeric material which can be employed within the present invention includes those elastomers which are known in the art, preferably, a silicone elastomer, nitrile elastomers, natural rubbers, fluorocarbon elastomers, styrene butadiene elastomers, ethylene-propylene elastomers, polyurethanes, neoprenes, polyacrylate elastomers, ethyl acrylates, fluorosilicone elastomers, highly saturated nitrile elastomers, and carboxylated nitrile elastomers, more preferably silicone elastomers. Mixtures of these elastomer, e.g., a mixture of natural rubber and styrene butadiene elastomers, can also be employed.

However, it is important to recognize that the selection of the elastomeric material to be employed is based upon the desired end use of the seal or gasket.

The shape and size of the gasket to be employed within the present invention is not critical as long as it can be effectively employed in the desired environment. However, the use of parylene allows for the uniform coating of gaskets having intricate shapes. See, for example, the shape illustrated by FIG. 1(d).

Figure 1A:
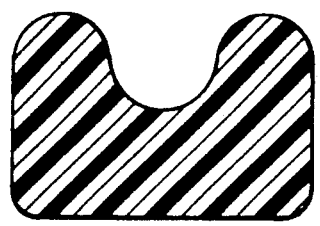
FIG. 1(a)-(d) illustrates a variety of cross-sectional shapes for seals or gaskets according to the present invention.
Figure 1B:
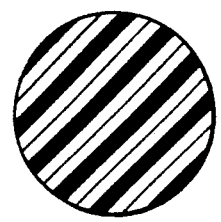
Figure 1C:
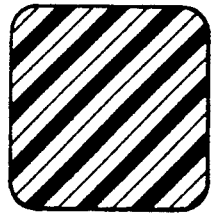
Figure 1D:
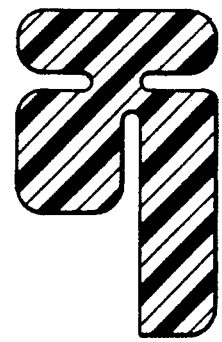

Other, typical shapes for the cross-section of the gasket include those illustrated in FIG. 1(a)-(c).

The product according to the present invention has a layer comprising at least one parylene coated on the outside thereof. Parylene is a generic name for a series of polymeric materials developed by Union Carbide Corporation.

Specific examples of the parylenes which can be employed in the present invention include parylene N, which is poly-p-xylylene, parylene C, in which a chlorine atom has been substituted for one of aromatic hydrogens and parylene D which includes 2 chlorine atoms substituted onto the aromatic group.

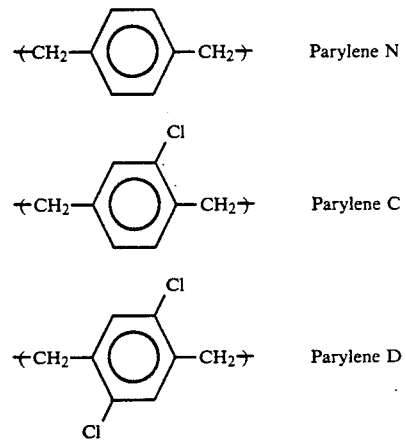

The seal or gasket according to the present invention can be provided by coating the elastomeric material by any technique which is recognized in the art. For example that method discussed in the NOVATRAN Custom Coating Services document entitled "Parylene Conformal Coating Systems" which is incorporated herein by reference can be employed.

The coating layer has a thickness which is effective to reduce the surface energy of the elastomer, preferably this thickness ranges from 0.1 to 3 microns, most preferably 0.5 to 2 microns.

The product according to the present invention has a number of advantages over traditional seals and gaskets. In particular, the gasket according to the present invention has a significant reduction in outgassing when compared to non-coated elastomeric materials. This is particularly important when the seals or gaskets are used in proximity of or for isolation of computer and electronic equipment.

Because the coating effectively alters the surface energy of the elastomeric materials, airborne particles and fibers are no longer attracted thereto. It also is effective in altering the adhesion properties of the elastomers in order to prevent the undesirable sticking of the gasket or seal on to metal equipment.

The following examples illustrate the advantages which can be associated with the present invention and are understood to be illustrative and not limitive.

EXAMPLES

Comparative Example 1

Samples 1-3 all relate to uncoated silicone elastomer gaskets which have been subjected to the post-bake conditions set forth in Table I and which are tested at 150° C. for 24 hours at 0.10 torr. The outgassing results associated therewith are illustrated in Table I.

TABLE I

| Sample | Postbake Conditions | Total Mass Loss (%) | Condensible Outgassed Products (%) |
|---|---|---|---|
| 1 | None | 1.397 | 0.744 |
| 2 | 4 Hrs, 400° F. 1 atm | 0.537 | 0.293 |
| 3 | 4 Hrs, 200° F. 1 torr | 1.218 | 0.646 |

EXAMPLE 2

Samples 4-7 relate to elastomer gaskets according to the present invention which have all been coated with parylene and samples 4-6 have been post-baked for 4 hours at 400° F. prior to coating. The cleaning conditions for each of the samples are set forth in Table II.

TABLE II

| Sample | Cleaning Conditions | Total Mass Loss (%) | Condensible Outgassed Products (%) |
|---|---|---|---|
| 4 | cleaned and primed | 0.127 | 0.030 |
| 5 | cleaned, no primer | 0.113 | 0.027 |
| 6 | plasma clean | 0.106 | 0.040 |
| 7 | 12 Hr. vacuum prebake | 0.109 | 0.028 |

As can be seen by a comparison between the data presented with in Tables I and II, both the total mass loss and the condensible outgassed products are significantly decreased for the product according to the present invention when compared with the uncoated materials.

While the invention is described in terms of various preferred embodiments, the artisan will appreciate the various modifications, substitutions, omissions, and changes may be made without departing from the spirit thereof. Accordingly, it is intended that the scope of the present invention be defined solely by the scope of the following claims including equivalents thereof.

What is claimed is:

1. A seal or gasket consisting of an elastomeric material comprising a silicone elastomer which has a layer of parylene coated on the outer surface thereof wherein the parylene is selected from the group consisting of parylene C, parylene N, parylene D and mixtures thereof and further wherein the layer has a thickness which is effective to reduce the surface energy of the elastomeric material which allows the seal or gasket to be employed in an electronic or computer environment.

* * * * *